United States Patent [19]
Mitomo et al.

[11] Patent Number: 5,392,456
[45] Date of Patent: Feb. 21, 1995

[54] METHOD OF CONTROLLING FILTER TIME CONSTANT AND FILTER CIRCUIT HAVING THE TIME CONSTANT CONTROL FUNCTION BASED ON THE METHOD

[75] Inventors: Isamu Mitomo, Hachioji; Nobuo Tsukamoto, Tachikawa; Arata Nakagoshi, Kokubunji; Jiroh Sakaguchi, Tama; Kazuo Yamakido, Tokyo; Hiroshi Noguchi, Tokyo; Atushi Hoshi, Tokyo, all of Japan

[73] Assignees: Hitachi, Ltd.; Kokusai Electric Co., Ltd., both of Tokyo, Japan

[21] Appl. No.: 592,340

[22] Filed: Oct. 3, 1990

[30] Foreign Application Priority Data

Oct. 6, 1989 [JP] Japan .................. 1-260027

[51] Int. Cl.⁶ .................................. H04B 1/10
[52] U.S. Cl. .................... 455/38.3; 455/307; 455/339; 455/340; 333/17.1; 333/172; 333/174; 307/521
[58] Field of Search ............ 455/38.2, 38.3, 307, 455/339, 340, 70, 71, 266; 307/520, 521; 328/167; 333/17.1, 172, 174; 340/825.44

[56] References Cited

U.S. PATENT DOCUMENTS

| | | | |
|---|---|---|---|
| 4,392,068 | 7/1983 | Welles, II | 333/172 |
| 4,785,253 | 11/1988 | Hughes | 307/521 |
| 4,818,903 | 4/1989 | Kawano | 307/521 |
| 5,058,204 | 10/1991 | Tahernia et al. | 455/266 |
| 5,101,509 | 3/1992 | Lai | 455/340 |

FOREIGN PATENT DOCUMENTS

| | | | |
|---|---|---|---|
| 1163921 | 2/1964 | Germany | 333/17.1 |
| 0022348 | 3/1978 | Japan | 333/17.1 |
| 0214617 | 10/1985 | Japan . | |

OTHER PUBLICATIONS

"On Chip Tuning for CMOS Continuous-Time Filter" Banu, M. et al., *IEEE Int. Solid State Conference*, Feb. 1985.

Primary Examiner—Curtis Kuntz
Assistant Examiner—Andrew Faile
Attorney, Agent, or Firm—Antonelli, Terry, Stout & Kraus

[57] ABSTRACT

A method of controlling the time constant of a filter for use in a radio receiver which receives a signal, transmitted from a transmitting station at a predetermined period, intermittently at the predetermined period and demodulates and delivers the received signal, a filter circuit having the time constant control function based on the method, and a radio receiver having the filter circuit. Preferably, the filter has its time constant switchable stepwise and specifically, parallel connection of capacitors or shortcircuiting of resistors is controlled by turning on/off switches. A controller within the filter circuit or the radio receiver performs control for applying a predetermined periodical signal (or standard pulse signal) to the filter and controlling the time constant of the filter in accordance with an output signal (or triangular pulse) during a first time zone within each operation interval for the intermittent reception and for filtering the signal from the transmitting station and causing a demodulating circuit to demodulate and deliver a filtered signal.

17 Claims, 7 Drawing Sheets

METHOD OF CONTROLLING FILTER TIME CONSTANT AND FILTER CIRCUIT HAVING THE TIME CONSTANT CONTROL FUNCTION BASED ON THE METHOD

BACKGROUND OF THE INVENTION

1. Field of the Invention

The present invention relates to a method of controlling the time constant of a filter and a filter circuit having the time constant control function based on the method, and more particularly to a time constant control method suitable for a filter of a receiving unit of a paging radio receiver which is required to be reduced in voltage, power and size.

2. Description of the Related Art

In a conventional filter time constant control system, the operation of filtering a received signal and the operation of controlling the time constant of a filter circuit for filtering are carried out in parallel.

For example, there are provided a filter for filtering an input signal (hereinafter referred to as a main filter), a control circuit for controlling the time constant of the main filter, and an artificial filter having the same construction as that of the main filter, whereby a standard pulse signal having a predetermined frequency is applied or inputted to the artificial filter so that the artificial filter may deliver an output signal the level of which is compared with a predetermined reference level. As a result of the comparison, a voltage or current complying with an error between the output and reference levels is fed back to the artificial filter and supplied to the main filter, in a polarity which cancels the error.

In the above arrangement, when the relative accuracy (inclusive of control characteristics) between the main and artificial filters is designed to be high, the voltage or current fed back to the artificial filter can act on the main filter so as to cancel the error in the main filter.

Incidentally, used as the time constant control element within the filter is, for example, "ON" resistance of variable capacitor diodes or D-MOS's which are controllable by voltage or "ON" resistance of diodes which are controllable by current; but capacitors and switches acting as control elements which are on/off controlled for connection of capacitors are not used. The reason for this is as follows. As described previously, in the conventional receiving system, filtering of the received signal and time constant control of the main filter are carried out in parallel and therefore, if the control element such as the capacitor is used as the time constant control element, then the switch will be turned on or off, causing a noise which interferes with the main filter.

In another conventional system, an oscillator is constructed using time constant control elements within an artificial filter, a phase difference between an oscillation signal from the oscillator and a standard pulse signal having a predetermined frequency is detected, and a voltage complying with the phase difference is supplied to the artificial filter and a main filter. The voltage complying with the phase difference acts on the main filter as it acts on the artificial filter.

The aforementioned conventional systems are disclosed in JP-A-60-214617 and "On-chip Automatic Tuning for a CMOS Continuous-Time Filter", by Mihai Banu et al., ISSCC85/FRIDAY, FEBRUARY 15, IEEE International Solid-State Circuits Conference.

There is a desire to make a filter in the form of an LSI with its size and power reduced and especially to realize a small-sized paging radio receiver of reduced power consumption by using the filter in the form of the LSI. However, a ceramic filter is widely used in the conventional paging radio receiver and the size reduction of the receiver is limited. Further, in realizing the filter portion with the LSI, the monolithic (main) filter using variable capacitor diodes as time constant control elements must be used in combination with the artificial filter of the same construction and control circuit which are adapted to control the main filter, as described previously. Accordingly, the total area of the filter circuit inclusive of the control circuit and artificial filter causes a bottleneck to size reduction. In addition, the time constant control is effected during the signal receiving operation and disadvantageously power consumption is increased correspondingly.

Specifically, when the variable capacitor diode is used as the time constant control element of the filter, a control voltage of about 3 V is required for controlling the capacitance of the filter by about ±25%. When the time constant control element is so designed that "ON" resistance of D-MOS transistors is controlled by a gate voltage, the filter must be a differential active filter in order to compensate harmonic distortion generated by non-linearity of the D-MOS transistors and the use of the differential active filter is unsuited for redution of the circuit area.

SUMMARY OF THE INVENTION

An object of the invention is to provide a method of controlling the time constant of a filter having a small circuit area and operative at low power and low voltage, and a filter having the time constant control function.

Another object of the invention is to provide a radio receiving method suitable for a radio receiver which uses the aforementioned filter so as to be reduced in circuit area and operative at low power and low voltage.

To accomplish the first object, a filter time constant control method according to the invention comprises the steps of inputting a standard pulse signal having a predetermined frequency and a predetermined signal level to a filter in advance of each time that filtering of an input signal is effected at a predetermined timing, comparing an output signal level from the filter with a predetermined reference level, and adjusting the time constant of the filter in accordance with the comparison results.

To accomplish the second object, according to the invention, a radio receiving method applicable to a radio receiver in which circuits within the radio receiver are operated intermittently at a predetermined period, and a received signal is filtered during each operation interval and thereafter demodulated and delivered. The method comprises the steps of controlling the time constant of a filter in the radio receiver during a first time zone within each operation interval, and filtering, demodulating and delivering the received signal during a second time zone following completion of the time constant control.

Specifically, when the receiver is tuned to the transmitting station, a baseband circuit within the receiver responds to information allotted to time slots contained in a transmission signal to deliver a battery-saving signal (BS signal) at a predetermined period (21 sec pursuant to the standard).

Subsequently, the controller for controlling the time constant of the filter applies the standard pulse signal to the filter during a predetermined interval (for example, 3 msec) beginning with a predetermined timing following rise of the BS signal (for example, 10 msec after the rise), and a level of an output signal from the filter is compared with a predetermined reference level, whereby the filter time constant control is effected and after completion of each time constant control, the received signal is switched to the filter, demodulated by the demodulating circuit and delivered (in the form of, for example, sound or display).

A plurality of capacitors are connected in parallel (or resistance elements are connected in series) within the filter, and the controller selects from them necessary capacitors (or resistance elements) by means of switches in order to control the filter time constant. A ratio of capacitance among the plurality of capacitors connected in parallel (in the case of resistance element, a ratio of resistance) is increased sequentially at the rate of two times, for example, in such a fashion as 1, 2, 4, 8, . . .

The filter output signal level is subjected to analog-digital (A/D) conversion by an analog-digital (A/D) converter and the controller compares the converted signal level with a predetermined reference level, thereby performing the filter time constant control. Then, a reference voltage supplied to a standard pulse signal generator which generates the standard pulse signal inputted to the filter during the time constant control interval is used in common as a reference voltage used for A/D conversion by the A/D converter.

In the filter time constant control method according to the invention, prior to performing filtering of an input signal received at a predetermined timing, the standard pulse signal having a predetermined frequency and a predetermined signal level is applied to the filter and the time constant of the filter is controlled in accordance with an output signal from the filter, thereby ensuring that the artificial filter and the like circuits needed conventionally can be dispensed with and the power consumption and circuit area can be reduced.

The filter time constant control is carried out by turning on/off the switches to select necessary capacitors (or resistance elements) from the plurality of capacitors connected in parallel (or resistance elements connected in series) within the filter. Accordingly, the variable capacitor diode or differential active filter needed conventionally can be dispensed with, thus facilitating lowering of power supply voltage or size reduction of the filter per se.

Further, by increasing the capacitance ratio between sequential or adjacent capacitors (or resistance ratio between sequential or adjacent resistors) among the plurality of capacitors connected in parallel (or resistors connected in series) at the rate of two times and performing sequential selection and setting of time constant bits beginning with the maximum bit and ending in the minimum bit, the setting can be completed through the same number of setting operations as the number of bits.

Similarly, in the radio receiving method according to the invention, the time constant of the filter within the radio receiver is controlled during a predetermined interval following the start of each intermittent operation, and after completion of the filter time constant control, the received signal is demodulated during each predetermined interval, thereby ensuring that the artificial filter and the like circuits conventionally needed can be dispensed with and the power consumption and circuit area can be reduced.

Further, by using the reference voltage supplied to the standard pulse signal generator which generates the standard pulse signal inputted to the filter in common as the reference voltage used for A/D conversion of the filter output signal by the A/D converter, the influence of errors contained in the standard pulse signal per se upon the gain change of the A/D converter can be cancelled out.

The foregoing and other objects, advantages, manner of operation and novel features of the present invention will be understood from the following detailed description when read in connection with the accompanying drawings.

DESCRIPTION OF THE PREFERRED EMBODIMENTS

An embodiment in which a filter time constant control system of the invention is applied to a paging radio receiver will now be described with reference to the accompanying drawings.

Figure 1:
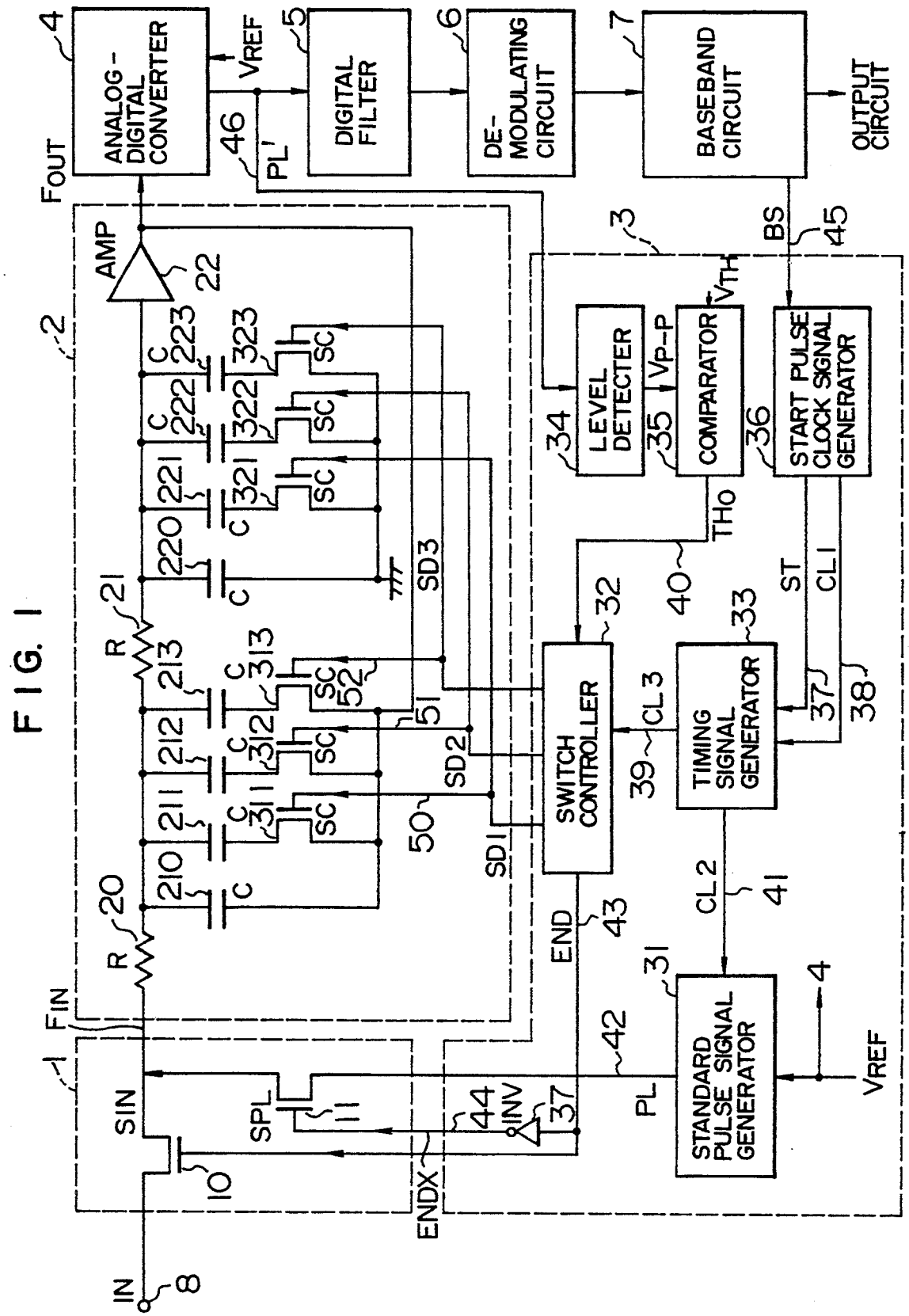
FIG. 1 is a schematic block diagram of a paging radio receiver to which the filter time constant control method of the invention is applied.

FIG. 1 is a schematic diagram showing the paging radio receiver to which the invention is applied. In the figure, reference numeral 1 designates an input switching circuit for selectively switching and receiving a signal received through an antenna (not shown) and a standard pulse signal for control of filter time constant, 2 a low-pass filter the time constant of which is variable, and 3 a control logic circuit for controlling the time constant of the filter 2. Additionally, the receiver comprises an analog-digital (A/D) converter 4 for converting an analog signal delivered out of the filter 2 into a digital signal, a digital filter 5, a demodulating circuit 6 for demodulating the digital signal, and a baseband circuit 7 for delivering a battery-saving signal (BS signal) to which the timing for intermittent operation of reception is referenced and also delivering an output signal to output circuits including a display, for example.

The baseband circuit 7 responds to the contents of a signal (control signal) received precedently from a transmitting station through the antenna to deliver the battery-saving signal (BS signal) at a predetermined period during a predetermined interval which starts at a certain timing. For example, when the transmitting station communicates with a plurality of receivers on time division base, a control signal transmitted from the transmitting station to each receiver contains information concerning time slots to be allotted to each receiver. Thus, the baseband circuit 7 delivers, at a start timing designated by the information, the BS signal at the predetermined period during the predetermined interval. A specified timing chart will be described later with reference to FIGS. 2 and 3.

For avoiding prolixity, output circuits (for example, liquid crystal display and the like) connected to the baseband circuit 7 and a circuit for generation of a reference voltage $V_{ref}$ supplied to the A/D converter 4 and the like are not illustrated in the drawing.

During the interval for delivery of the BS signal, the receiver controls the time constant of the filter, and demodulates and delivers the signal received from the transmitting station. In the present embodiment, before filtering of an input signal is effected by means of the filter, the time constant of the filter is controlled in advance.

The operation of demodulating a received signal after completion of control of the filter time constant will now be described.

A received signal is inputted through a signal input terminal 8 (IN), passed through a switch 10 (SIN) in the input switching circuit 1 and delivered to an input line ($F_{IN}$) of the filter circuit 2. The signal is then subjected to filtering in the filter 2 and inputted to the A/D converter 4. A converted digital output signal from the A/D converter 4 is supplied to the digital filter 5 and demodualted in the demodulating circuit 6. The baseband circuit 7 decodes a signal from the demodulating circuit 6 and delivers a decoded signal to the output circuits (for example, the display). Part of circuits within the receiver are supplied with the aforementioned BS signal from the baseband circuit 7 so that their power supplies may be turned "OFF" in the absence of time slots allotted to the station of its own, thereby preventing unnecessary power consumption. In the drawing, the internal power supplies, switches between the respective circuits and the respective power supplies and interconnections are not illustrated.

The operation to be carried out prior to the processing of the received signal during the filter time constant control interval will now be described.

During the interval for control of the time constant of the filter 2, a standard pulse signal (PL) generated from a standard pulse signal generator 31 is inputted to the filter 2 through a switch 11 (SPL). At that time, the switch 10 (SIN) is so controlled as to be turned off. An output signal from the filter is supplied via the A/D converter 4 to the control logic circuit 3 and the time constant of the filter is controlled in accordance with a level of an output signal of the circuit 3.

Figure 2:
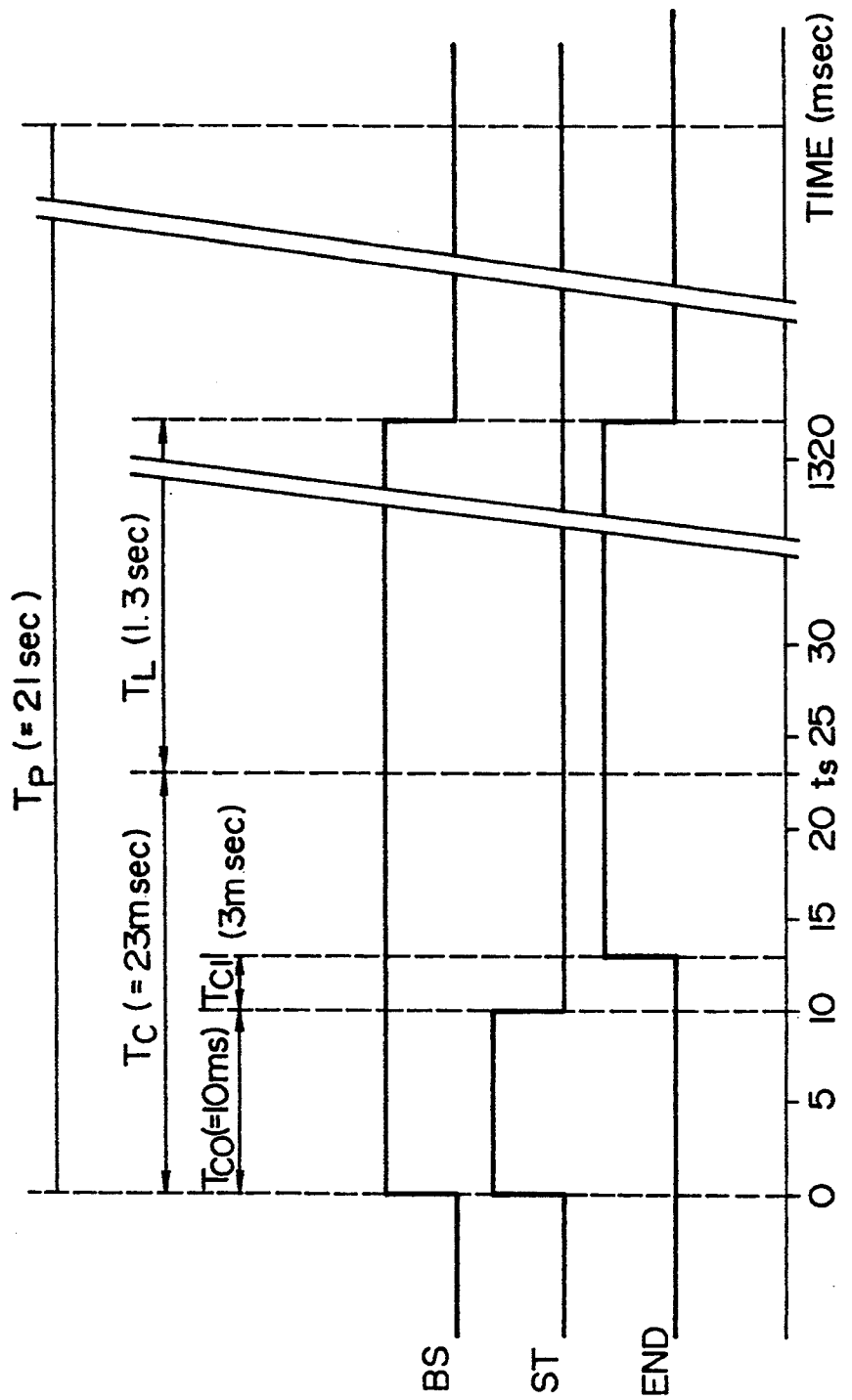
FIG. 2 is a time chart showing how the time constant control interval of filter and the demodulating interval of received signal are related to a battery-saving signal.

FIG. 2 is a time chart showing how the time constant control interval of filter 2 and the demodulating interval of received signal (hereinafter referred to as main receiving operation interval) are related to the BS signal.

As described previously, during the interval that the intermitting receiving channel is tuned to the transmitting station, the delivery of the BS signal is repeated at the predetermined period but in FIG. 2, only one period of the BS signal is illustrated.

Referring to FIG. 2, a start pulse signal (ST) is a signal generated, in response to the BS signal, from a start pulse clock signal generator 36 of FIG. 1. This ST signal is so controlled as to rise in synchronism with rise of the BS signal and fall at the expiration of $T_{co}$ interval. A control operation end pulse signal (END) is so controlled as to rise at the expiration of 13 msec beginning with rise of the BS signal and fall in synchronism with fall of the BS signal.

This END signal is delivered to the aforementioned input switching circuit 1, which turns on the switch 10 (SIN) during on-state of the signal (END). The END signal is inverted and delviered to the switch 11, thereby turning off the switch 11 (SPL) at that time. During off-state of the END signal, the switch 10 (SIN) is turned off and the switch 11 (SPL) is turned on.

The filter time constant control operation is carried out within an interval $T_{cl}$ between the fall of ST operation starts at $t_s$ at which an interval $T_c$ following signal and the rise of END signal. The main receiving the rise of BS signal expires and ends at the expiration of interval $T_L$ at which the BS signal falls. The interval $T_L$ is fixed to 1.3 sec pursuant to the system standard concerning paging radio receivers and the present embodiment agrees to this standard. Pursuant to the system standard, the period, $T_p$, of the bS signal is also fixed measuring 21 sec and the present embodiment also agrees to this standard in this respect.

The interval $T_{co}$ indicated in FIG. 2 is required in order that the function of individual circuits connected to the power supplies within the receiver can be stabilized in response to the BS signal, and an interval of 10 msec following the rise of END signal is required for start-up of the other digital circuit than the filter. These intervals may be set to appropriate values in course of filter circuit design or may be set to desired values.

The operation of each block comprised in the control logic circuit 3 of FIG. 1 will now be described in greater detail.

Receiving the BS signal, the start pulse clock signal generator 36 delivers the ST signal for determining the start of the control operation and the standard clock pulse signal (CL1 signal). A timing signal generator 33 receives these two pulse signals and delivers a clock pulse signal (CL2 signal) for determining the frequency of the standard clock signal PL and a clock pulse signal (CL3 signal) for causing a switch controller 32 to control the timing for switch control. The standard pulse signal generator 31 responds to the clock pulse CL2 to determine the frequency of the standard pulse signal PL and to the reference voltage $V_{ref}$ to determine the amplitude level of the standard pulse signal PL.

Figure 6:
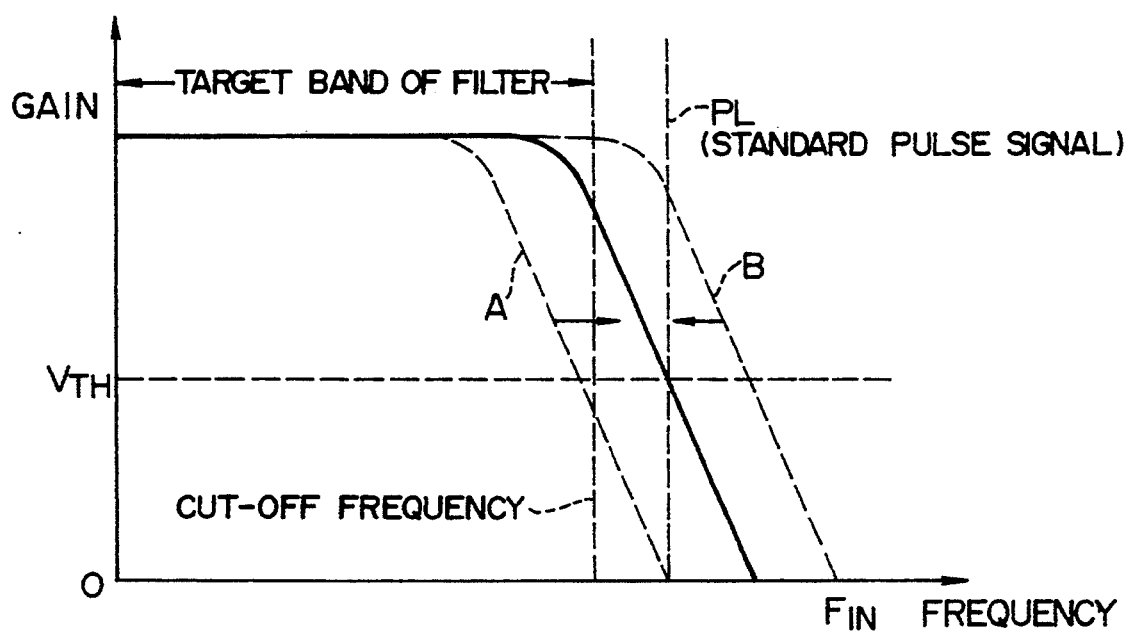
FIG. 6 is a graph for explaining the frequency band of a standard pulse signal used for the filter time constant control.

FIG. 6 is a graph useful in explaining the relation between the standard pulse signal P1 and filter characteristics of the filter 2. In the graph of FIG. 6, abscissa represents the frequency of the input signal to the filter and ordinate represents the output signal level (gain) from the filter.

The filter 2 has its filter characteristic which varies as shown at state A or B because of variations in resistance, temperature and the like factors as well as manufacture errors in capacitance. Accordingly, the shifting state A or B of filter characteristic must be corrected to a target filter characteristic by controlling the filter time constant. In the present embodiment, the filter time constant is controlled in accordance with results of a comparison between a filter output signal level and a predetermined signal level ($V_{TH}$). To this end, it is preferable to use as the standard pulse signal PL to be inputted to the filter a signal having such a frequency that the output signal level of the filter is affected greatly by variations in filter characteristic. Therefore, in the present embodiment, the standard pulse signal PL is so designed as to have a frequency in out-target band of the filter.

Further, in the present embodiment, the reference voltage $V_{ref}$ for determining the level of the standard pulse signal PL is also used as that for gain determination in the A/D converter 4.

For example, the signal level of the standard pulse signal PL can be expressed as $$PL = K1 \cdot V_{ref}$$

where K1 is constant, indicating that the standard pulse signal is a signal proportional to the reference voltage $V_{ref}$. On the other hand, a signal PL' delivered out of the A/D converter 4 has a signal level expressed as $$PL' = G \cdot V_{FOUT}$$

where G is constant and VFOUT is filter output voltage, indicating that the signal PL' is proportional to the signal level of $V_{FOUT}$.

It is to be noted that the relation between $V_{ref}$ supplied to the A/D converter 4 and constant G can be expressed by a formula of $G = K' \cdot 1/V_{ref}$ where K' is constant. When noticing that the output level of the signal is given by $V_{FOUT} = K2 \cdot PL$ where K2 is constant, the aforementioned latter equation is reduced as follows:

$$\begin{aligned} PL' &= G \cdot V_{FOUT} \\ &= G \cdot K2 \cdot PL \\ &= K' \cdot 1/V_{ref} \cdot K1 \cdot V_{ref} \cdot K2 \\ &= K' \cdot K1 \cdot K2, \end{aligned}$$

indicating that the reference voltage Vref has no influence upon the signal PL'. Accordingly, by using the same reference voltage $V_{ref}$ in common for the standard pulse signal generator 31 and A/D converter, the influence of errors interfering with $V_{ref}$ can be cancelled out.

In order to on/off control switches associated with capacitors (C's) 211 to 213 and 221 to 223 used for time constant control (hereinafter simply referred to as "on/off control capacitors"), the switch controller 32 delivers switch drive signals SD1, SD2 and SD3 and the aforementioned END signal. Timings for these signals are determined by the input clock CL3. The "H" or "L" state of the switch drive signals SD1, SD2 and SD3 ("H" for turn-on of switch and "L" for turn-off of switch) is sequentially determined in accordance with the "H" or "L" polarity of a decision output signal THO of a comparator 35. A level detector 34 detects a peak to peak value ($V_{p-p}$) from AC amplitude of the standard pulse signal PL' delivered out of the A/D converter 4 and delivers the detected value to the comparator 35. The reason why the $V_{p-p}$ value is detected is that the PL' signal sometimes contains a DC offset component due to an amplifier 22 comprised in the filler 2 and a level decision error due to this component must be prevented. The comparator 35 delviers "H" when the level deteection output $V_{p-p}$ value is higher than a threshold value $V_{TH}$ but "1" when lower.

As shown in FIG. 1, the filter 2 includes a resistor (R) 20 connected to the input signal line ($F_{IN}$), a first stage filter comprised of a plurality of capacitors 210 to 213 connected in parallel to the output end of the resistor 20, a resistor 21 and a second stage filter comprised of a plurality of capacitors 220 to 223. Especially, for capacitor connection control, the capacitors 211 to 213 are associated with switches (SC's) 311 to 313, respectively, and the capacitors 221 to 223 are associated with switches 321 to 323.

Three bits are needed for control of the filter time constant. More specifically, the capacitors 211 and 221 are on/off controlled in accordance with "H" or "L" of the switch drive signal SD1 (first bit), the capacitors 212 and 222 are on/off controlled in accordance with "H" or "L" of the switch drive signal SD2 (second bit), and the capacitors 213 and 223 are on/off controlled in accordance with "H" or "L" of the switch drive signal SD3 (third bit).

A ratio of capacitance among the capacitors to be on/off controlled by the first to third bits is set to be 4:2:1 so that a ratio of 2:1 may be set up between sequential capacitors. More specifically, the capacitors 211 and 221 are designed to have a sum capacitance of 4(pF). The capacitors 212 and 222 a sum capacitance of 2(pF) and the capacitors 213 and 223 a sum capacitance of 1(pF). By setting the capacitance ratio among the capacitors in the manner as above, the three control bits can be used to control the capacitance in unit of a minimum controllable capacitor capacitance of 1(pF) within a control range of 7(pF). Accordingly, given that the fixed capacitors 210 and 220 have a sum capacitance of 10(pF), the total capacitor capacitance can be controlled within a control range of from 10 to 17(pF).

Figure 3:
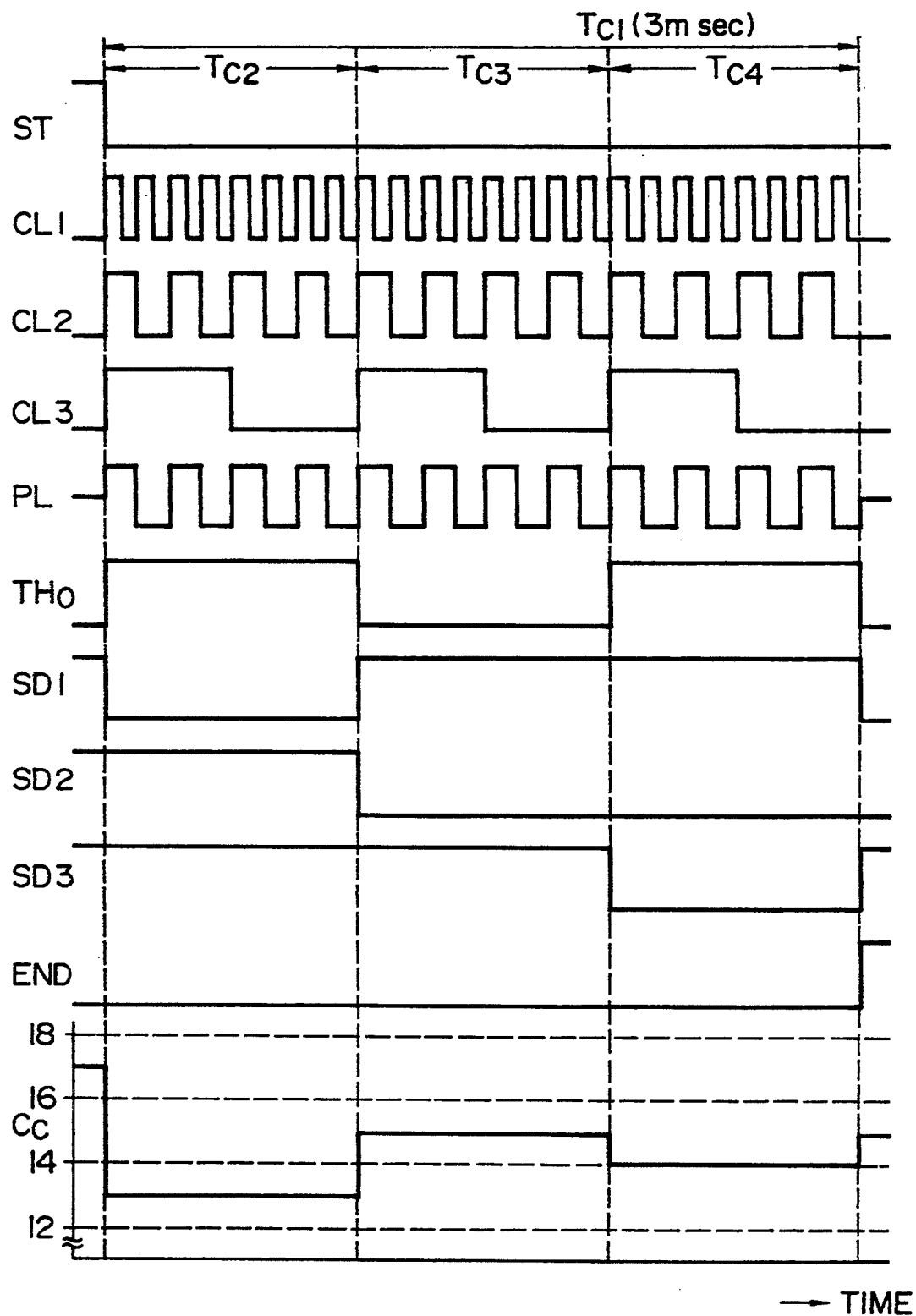
FIG. 3 is a time chart showing clock signals and switch drive signals appearing during the filter time constant control interval.

Referring now to FIG. 3 the relation between the filter time constant control operation and the previously-described clock signals CL1 to CL3 and switch drive signals SD1 to SD3 will now be described. For convenience sake, an example will be explained where the filter time constant control is carried out to set the filter capacitance to 15(pF).

In synchronism with fall of the aforementioned start pulse signal (ST signal), the start pulse clock signal generator 36 delivers the clock pulse CL1 having a period of 125 μsec. The timing signal generator 33 references this clock pulse C1 to deliver the clock pulse CL2 having a period of 250 μsec and the clock pulse CL3 having a period of 1 msec. The standard pulse signal PL delivered out of the standard pulse signal generator 31 is a rectangular wave having a frequency coincident with that of CL2. At the timing for control start, the switch drive signals SD1, SD2 and SD3 are all rendered "H", with the result that the switches 311 to 313 and 321 to 323 are all rendered "ON". At the first rise of CL3, the signal SD1 is rendered "L" to bring the corresponding switches 211 and 321 into "OFF" state which is held during one period (1 msec) of CL3. This 1 msec time is required in order that the filter output signal after switchover of the switches can be stabilized. Thus, in accordance with a value of comparator output THO immediately before the second rise of CL3, the state ("L" or "H") of the switch drive signal SD1 is determined.

Since in this example the $V_{TH}$ is so set as to make the filter capacitance 15(pF), the output value THO of the comparator 35 is "H". As a result, the switch controller 32 sets the switch drive pulse SD1 to "H". Subsequently, at the second rise of CL3, the signal SD2 is set to "L". As a result, the switches 312 and 322 are rendered "OFF". Similarly, at the third rise of CL3, the immediately preceding THO is "L" and therefore the switch controller 32 sets the SD2 to "L" in order to render the switches 312 and 322 "OFF" and at the same time sets the SD3 to "L". Consequently, the switches 313 and 323 are rendered "OFF". At the fourth rise of CL3, the immediately preceding THO is "H" and therefore the switch controller 32 sets the SD3 to "H" in order to render the switches 313 and 323 "ON" and at the same time sets the control end pulse (END signal) to "H". As a result, the switch SIN is turned on and the switch SPL is turned off in the input switching circuit 1, thereby bringing about the state where the main signal reception can be permitted.

As described above, by setting the switching capacitors of the filter sequentially from the maximum bit to the minimum bit, the control operation of all time constants can be completed when setting of the minimum bit ends.

The total filter capacitance Cc can be changed through the above capacitor control operation as shown at the bottom section in FIG. 3. At the end of the control operation, the value of Cc measures 15(pF) within the adjusting range of from 10 to 17(pF). In the present embodiment, the control switches 311 to 313 and 321 to 323 are set in such a manner that all the switches are rendered "ON" upon start and the switch drive pulses are rendered "L" sequentially beginning with the drive signal SD1. In an alternative, however, a method based on the inverted polarity may be employed wherein all the switches are rendered "OFF" upon start and the switch drive pulses are rendered "H" sequentially beginning with the SD1 signal.

Further, in the foregoing embodiment, the time constant of the filter 2 is controlled by switching the capacitor capacitance but alternatively the time constant control can be effected by switching resistance.

Figure 4:
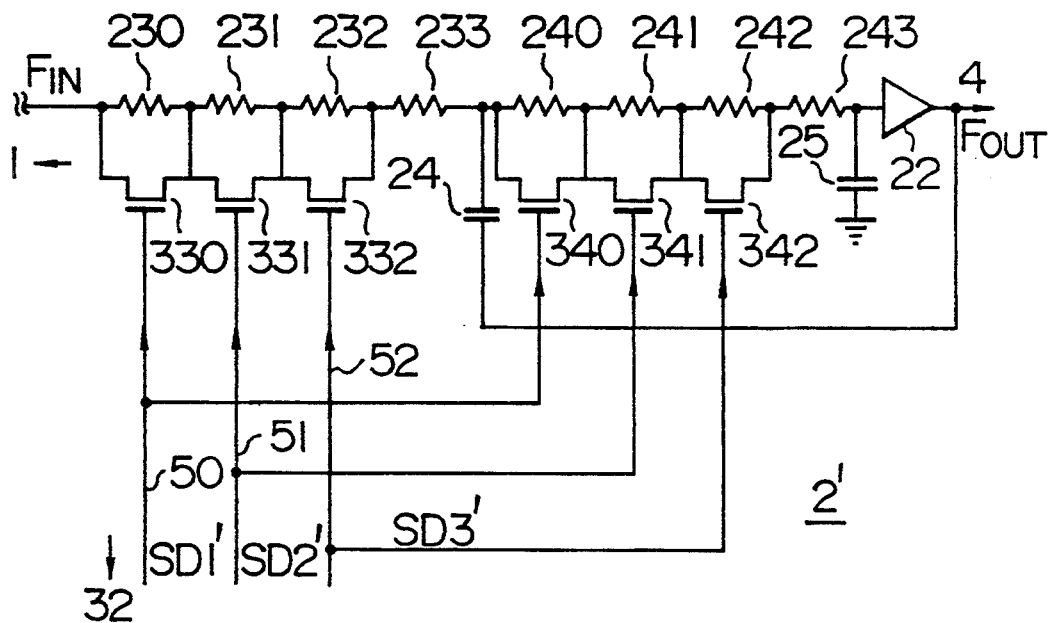
FIG. 4 is a circuit diagram of a filter in which the time constant is controlled by switching resistance.

FIG. 4 is a circuit diagram showing a filter construction in which the resistance is changed. As shown in the filter designated by 2', an input line ($F_{IN}$) of the filter is connected to the input switching circuit 1 and an output terminal (FOUT) is connected to the A/D converter 4 as in the case of the filter 2 of FIG. 1, and internal resistors 230 to 232 and 240 to 242 are controlled for short-circuiting by means of associated switches 330 to 332 and 340 to 342.

The filter 2' is a low-pass filter including a first stage filter comprised of resistors 230 to 233 connected in series with the input line ($F_{IN}$) and a capacitor 24, and a second stage filter comprised of resistors 240 to 243 connected in series and a capacitor 25. The resistors 230 and 240, 231 and 241, and 232 and 242 are controlled in accordance with "H" or "L" of switch drive signals SD1' to SD3'. When a ratio of resistance among these sets of resistors is set to be 4:2:1 (for example, the resistor sets have resistances of 4 Ω, 2 Ω and 1 Ω, respectively), the three control bits (SD1' to SD3') can be used to control the resistance in unit of minimum controllable resistance of 1(Ω) within a control range of 7(Ω).

Since in this embodiment the individual resistance are short-circuited when the SD1' to SD3' signals are rendered "H" the polarity of the SD1' to SD3' must be inverted as compared to that of the SD1 to SD3 signals explained in connection with FIG. 3.

Figure 5:
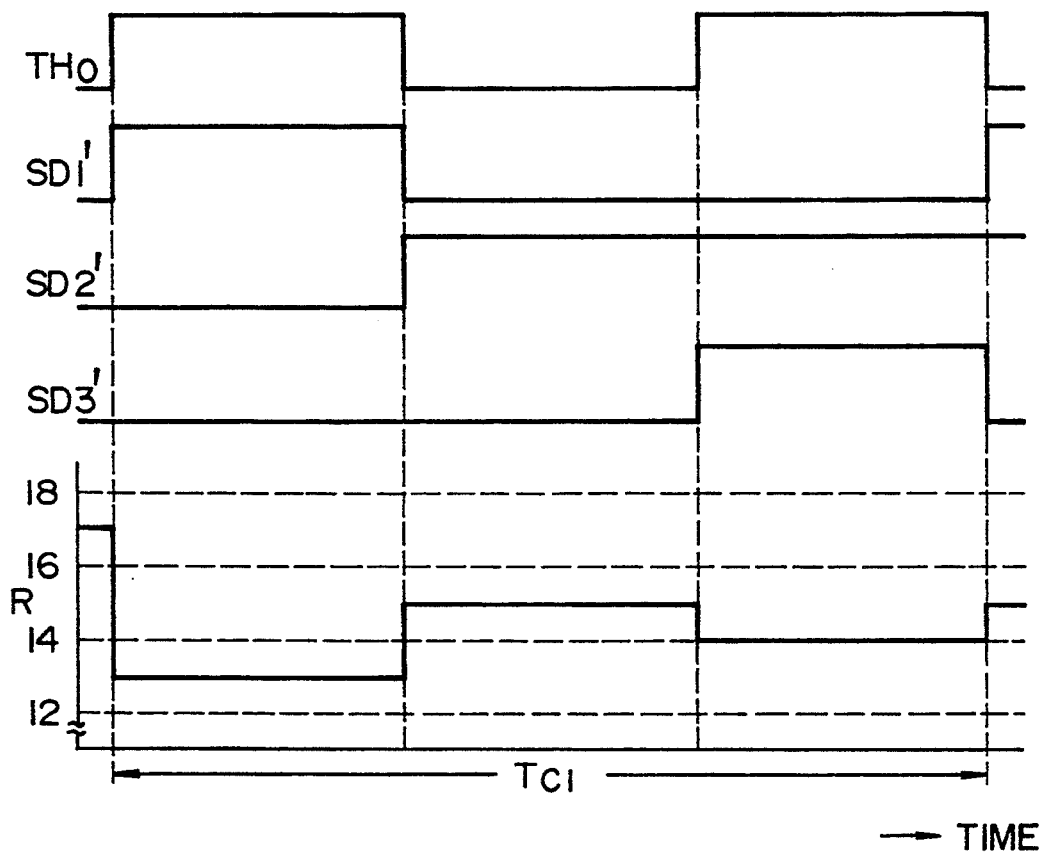
FIG. 5 is a time chart showing signals appearing during the time constant control interval of the filter shown in FIG. 4.

When the time constant control is carried out using the filter 2', the switch drive signals (SD1' to SD3' signals) and the total resistance, R, are changed as shown in FIG. 5. The behavior shown in FIG. 5 resembles in principle that in FIG. 3 and will not be described herein.

In the foregoing embodiments, the filter time constant control system of the invention has been described as applied to the paging radio receiver which performs the receiving operation periodically. However, the filter time constant control system according to the invention may also be applied to an apparatus wherein a filter is comprised in the apparatus, the time constant of the filter is controlled for correction and thereafter the controlled and corrected filter is used for an intended signal processing. For example, a radio, a television and a communication terminal may be enumerated as this type of apparatus. In this case, the connective relation between the filter 2 and time constant control circuit must be changed slightly. For example, when the filter output signal takes the form of an analog value, the output signal of the filter 2 of FIG. 1 may be inputted directly to the level detector 34 and connected to output circuits handling the filter analog output signal as it is.

The foregoing embodiments have been described as directed to automatic correction of manufacture errors of the filter time constant but the filter in these embodiments may readily be used as a variable filter if the threshold voltage $V_{TH}$ of the FIG. 1 comparator or the level or frequency of the standard pulse signal PL is adjusted.

A second embodiment of the invention as applied to the paging radio receiver will now be described.

The foregoing embodiments use the standard pulse signal of the predetermined frequency and level as the signal inputted to the filter during the time constant control interval. Contrary to this, in the second embodiment, a triangular wave is generated using time constant determining elements of a filter, the output level of the triangular wave is compared with a fixed reference level, and the filter time constant is controlled and switched in accordance with the magnitude relation between the compared levels.

Figure 7:
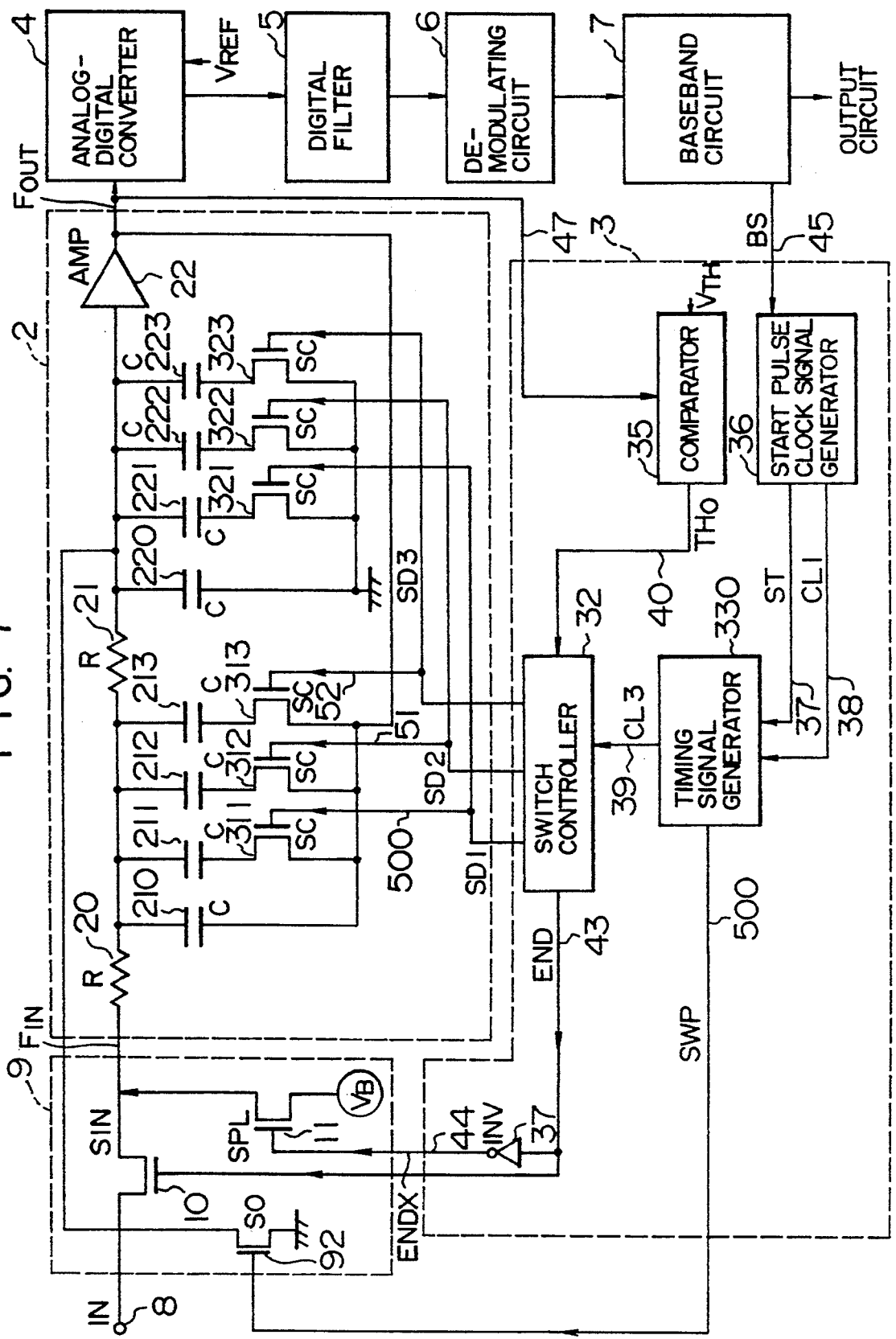
FIG. 7 is a schematic block diagram showing another embodiment of the paging radio receiver to which the filter time constant control method of the invention is applied.

FIG. 7 is a diagram for explaining the second embodiment. Referring to FIG. 7, a triangular wave generator 9 includes an input switching circuit for generating a triangular wave and a switch circuit which is on/off controlled to connect/disconnect the opposition ends of capacitors. Denoted by 30 is a control logic circuit for controlling the time constant of the filter 2. The function and operation of components 8, 2, 4, 5, 6 and 7 are the same as that of the corresponding components in FIG. 1 and will not be described herein.

Applied to a switch (SPL) 11 of the input switching circuit is a DC voltage $V_B$. A switch (SO) 92 has one end grounded and the other end connected to the input of an amplifier 22 provided for capacitors 220 to 223 of a filter 2.

The control logic circuit 30 has no circuit corresponding to the standard pulse signal generator 31 of FIG. 1. In the second embodiment, a timing signal generator 330 delivers a pulse (SWP) 500 for on/off controlling the switch (SO) 92 of the triangular wave generator 9. An output signal ($F_{OUT}$) 47 of the filter 2 is applied directly to a comparator 35. Accordingly, in contrast to the digital type comparator in the first embodiment, the comparator in the second embodiment is of an analog type. The remaining portion of the control logic circuit 30 is the same as that of the circuit 3 in the first embodiment and will not be described herein.

Alternatively, the triangular wave generator 9 may be connected, for example, between a resistor (R) 21 and a capacitor 213 in the filter 2.

Since in the first embodiment the capacitor corresponding to each bit is rendered "OFF" at the rise of CL3 and there results a transient response, it takes 1 msec (corresponding to 4 periods of the standard pulse signal) for the level of standard pulse signal PL to become stable, totalling 3 msec for 3 bits. However, in the second embodiment, the opposite ends of the capacitor are short-circuited at the rate of one period of the signal by means of the switch (SO) 90 to reset the level and therefore the influence of the transient response becomes negligible. Accordingly, when the period of the switch drive pulse SWP (FIG. 7) is designed to be identical to that of the standard pulse signal PL (FIG. 3), the period of CL3 (FIG. 7) becomes ¼ of the period of CL3 (FIG. 3) and the total time $T_{C1}$ required for time constant control measures 0.75 msec which is ¼ of 3 msec.

Figure 8:
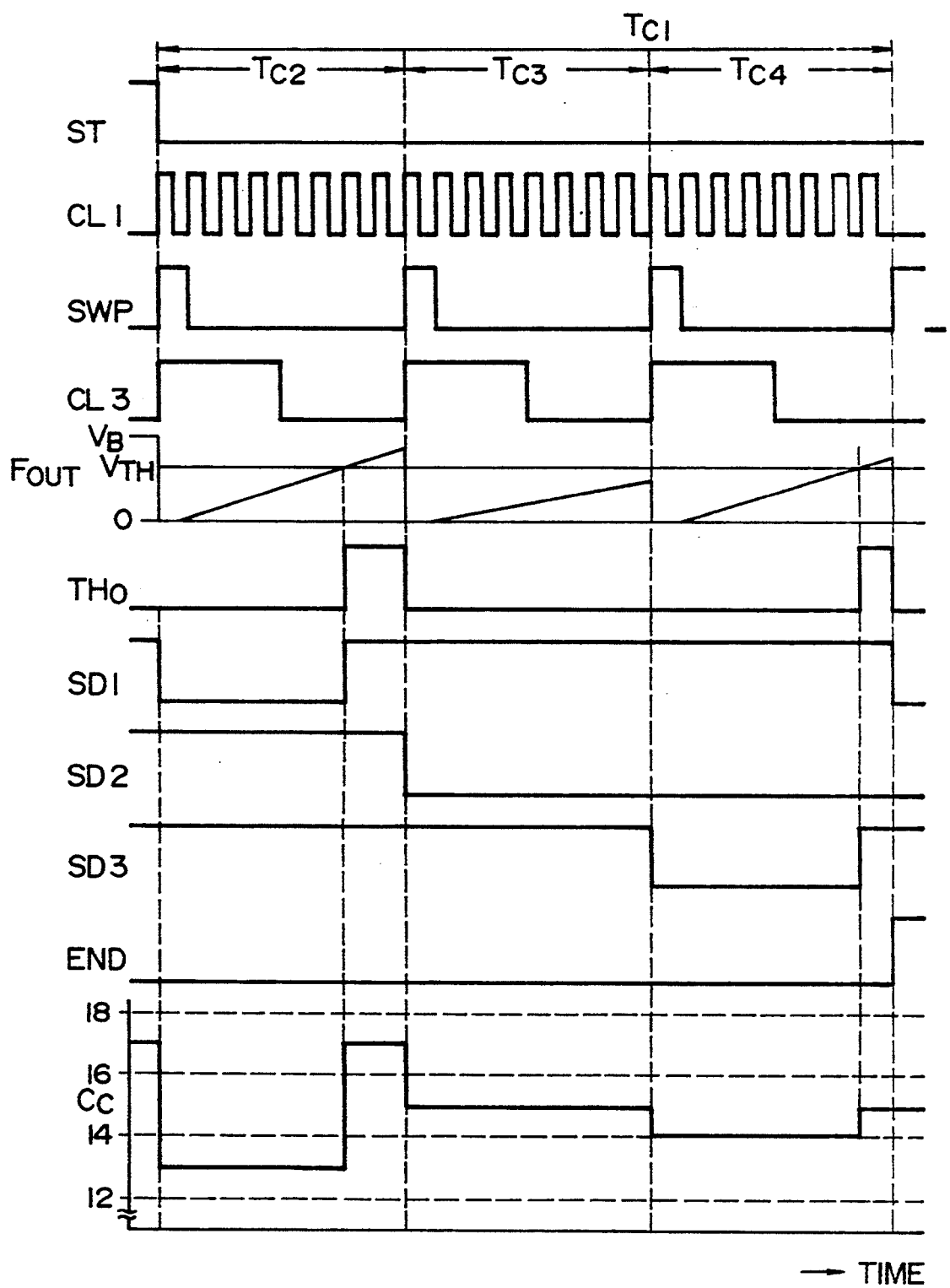
FIG. 8 is a time chart showing clock signals and switch drive signals appearing during the filter time constant control interval in the FIG. 7 embodiment.

Referring now to FIG. 8, signal waveforms at various points in the second embodiment will be described. Waves ST, CL1, CL3 and END in FIG. 8 resemble those in FIG. 3 and their description will be omitted.

In FIG. 8, the drive pulse SWP is to on/off control the switch (SO) 92 and in this example the switch is turned on with high level "H" of the drive pulse and turned off with low level "L" of the drive pulse. The output signal $F_{OUT}$ of the filter 2 stands for an input signal to the comparator 35. Simultaneously indicated on ordinate of a graph section indicating the $F_{OUT}$ waveform are a threshold voltage $V_{TH}$ of the comparator 35 and a DC voltage $V_B$. The output signal, THO, of the comparator 35 is rendered high level "H" when the level of the input signal ($F_{OUT}$) 47 is higher than the threshold $V_{TH}$ but is rendered low level "L" when lower.

These waveforms take place in the case where the total capacitance of the capacitors within the filter is set to 15(pF) as in the case of FIG. 3 corresponding to the first embodiment.

The signals SD1, SD2 and SD3 start falling at the same timing or phase as that in the first embodiment (see FIG. 3) but start rising at earlier timings than those in the first embodiment (see FIG. 3). For these reasons, the waveform of the total capacitance Cc of the capacitors varies differently from that shown in FIG. 3 but the ultimate total capacitance Cc of the capacitors can also be converged to 15(pF).

As is clear from the description of the foregoing embodiments, according to the filter time constant control system of the invention, the filter capable of controlling the time constant can be reduced in its circuit area and power consumption.

Specified effects can be enumerated as below.

The first effect is such that the power consumption reduction can be attained by separating the time constant control operation from the normal operation and completing the former operation within a short interval of time. As described previously, while the received signal demodulating interval of the paging radio receiver is 1300 ms, the time constant control interval (Tcl) of the filter is 3 msec. Thus, the time ratio of the time constant control interval to the demodulating interval of the received signal is about 0.23%, indicating that power consumption during the time constant control interval can be reduced to a level which is almost negligible.

The second effect is such that the invention does not require the conventional artificial filter and the circuit area and power consumption can be reduced correspondingly. This is because in the present invention, the standard pulse signal is applied directly to the filter used for filtering the received signal without resort to the artificial filter and the output level of the filter is compared with the reference level to detect the time constant difference.

The third effect is such that there is no need of using a filter including variable capacitor diodes as time constant control elements and therefore no high control voltage is required, thereby ensuring reduction in power supply voltage. In addition, such a differential active filter as used in the case where ON resistance of D-MOS is utilized can be unneeded and therefore the circuit area can be reduced.

The fourth effect is such that the control time can be reduced by setting a ratio of capacitance (or resistance) among capacitors (resistors) used as time constant control elements to 4:2:1 to set up a ratio of 2:1 between sequential elements and by shifting the setting operation sequentially from the maximum bit to the minimum bit during the time constant controlling. In the embodiments, the number of bits is 3 and the time constant control operation can be completed through three-times setting operations (about 3 msec).

We claim:

1. A method of controlling the time constant of a filter operable to intermittently filter an input signal to deliver the same, said filter having means for stepwise switching of the time constant of the filter, comprising the steps of:

inputting to said filter a standard signal having a predetermined frequency and a predetermined signal level during a predetermined interval preceding each filtering operation, said filter including n (n being an integer) elements for changing the time constant, the time constant being switchable stepwise $2^n$ times;

switching the time constant of said filter by a maximum of n times in accordance with an output signal from said filter; and performing filtering of the input signal after completion of switching of the time constant of said filter.

2. A method of controlling the time constant of a filter according to claim 1, wherein said predetermined frequency of said standard signal is a frequency in a transient region of the frequency characteristics of said filter.

3. A filter circuit for controlling the time constant of a filter each time that intermittent filtering of an input signal is effected by means of said filter, comprising:

said filter for filtering said input signal, said filter having means for stepwise switching of the time constant of the filter $2^n$ times by n elements for changing the time constant (n being an integer);

a controller for controlling the time constant of said filter; and a selector for selectively inputting to said filter either said input signal or a standard signal having a predetermined frequency and a predetermined signal level in response to a command from said controller, wherein said controller applies said standard signal to said filter in advance of each filtering operation and responds to an output signal from said filter to control the time constant thereof.

4. A filter circuit for controlling the time constant of a filter each time that intermittent filtering of an input signal is effected by means of said filter, comprising:

said filter having means for stepwise switching the time constant of said filter;

a controller for controller the time constant of said filter; and a selector, responsive to a command from said controller, for selectively inputting to said filter either said input signal or a periodical signal having a predetermined frequency and a predetermined signal level, wherein said controller applies said periodical signal to said filter in advance of each filtering operation and responds to an output signal from said filter to control the time constant thereof;

wherein said filter includes a plurality of capacitors connectable in parallel under the control of said controller and having a ratio of capacitance between sequential capacitors which is 1:2, and said controller responds to the output signal from said filter to control sequential connection of said capacitors beginning with a capacitor of a maximum capacitance and ending in a capacitor of a minimum capacitance so as to control the time constant of said filter.

5. A filter circuit for controlling the time constant of a filter each time that intermittent filtering of an input signal is effected by means of said filter, comprising:

said filter having means for stepwise switching the time constant of said filter;

a controller for controlling the time constant of said filter; and a selector, responsive to a command from said controller, for selectively inputting to said filter either said input signal or a periodical signal having a predetermined frequency and a predetermined signal level, wherein said controller applies said periodical signal to said filter in advance of each filtering operation and responds to an output signal from said filter to control the time constant thereof;

wherein said filter includes a plurality of resistance elements connected in series and short-circuited under the control of said controller and having a ratio of resistance between sequential resistance elements which is 1:2, and said controller responds to the output signal from said filter to control sequential short-circuiting of said resistance elements beginning with a resistance element of a maximum resistance and ending in a resistance element of a minimum resistance so as to control the time constant of said filter.

6. A filter circuit for controlling the time constant of a filter each time that intermittent filtering of an input signal is effected by means of said filter, comprising:

said filter for filtering said input signal, said filter having means for stepwise switching of the time constant of said filter $2^n$ times by n elements for changing the time constant of the filter (n being an integer);

a controller for controlling the time constant of said filter; and a selector for selectively connecting to said filter either an input line of said input signal or a constant voltage source for causing said filter to generate a triangular wave in response to a command from said controller;

wherein said controller connects said constant voltage source to said filter in advance of each filtering operation and responds to a triangular-wave output signal from said filter to control the time constant thereof.

7. A filter circuit for controlling the time constant of a filter each time that intermittent filtering of an input signal is effected by means of said filter, comprising:

said filter having means for stepwise switching the time constant of said filter;

a controller for controlling the time constant of said filter; and a selector, responsive to a command from said controller, for selectively connecting to said filter either an input line of said input signal or a constant voltage source for causing said filter to generate a triangular wave;

wherein said controller connects said constant voltage source to said filter in advance of each filtering operation and responds to a triangular wave output signal from said filter to control the time constant thereof wherein said filter includes a plurality of capacitors connectable in parallel under the control of said controller and having a ratio of capacitance between sequential capacitors which is 1:2, and said controller responds to the output signal from said filter to control sequential connection of said capacitors beginning with a capacitor of a maximum capacitance and ending in a capacitor of a minimum capacitance so as to control the time constant of said filter.

8. A filter circuit for controlling the time constant of a filter each time that intermittent filtering of an input signal is effected by means of said filter, comprising:

said filter having means for stepwise switching the time constant of said filter;

a controller for controlling the time constant of said filter; and a selector, responsive to a command from said controller, for selectively connecting to said filter either an input line of said input signal or a constant voltage source for causing said filter to generate a triangular wave;

wherein said controller connects said constant voltage source to said filter in advance of each filtering operation and responds to a triangular wave output signal from said filter to control the time constant thereof;

wherein said filter includes a plurality of resistance elements connected in series and short-circuited under the control of said controller and having a ratio of resistance between sequential resistance elements which is 1:2, and said controller responds to the output signal from said filter to control sequential short-circuiting of said resistance elements beginning with a resistance element of a maximum resistance and ending in a resistance element of a minimum resistance so as to control the time constant of said filter.

9. A radio receiver for receiving a signal, transmitted from a transmitting station at a predetermined period, intermittently during said period and demodulating and delivering the same, comprising:

a filter for filtering an input signal and having means for stepwise switching of the time constant of the filter $2^n$ times by n elements for changing the time constant (n being an integer);

a demodulating circuit for demodulating and delivering an output signal from said filter;

a controller for controlling the time constant of said filter; and an input switching circuit, responsive to a command from said controller, for selectively inputting to said filter either the signal from said transmitting station or a standard signal having a predetermined frequency, wherein said controller performs control for applying said standard signal to said filter to control the time constant of said filter in accordance with the output signal from said filter during a first time zone within said period and for filtering, demodulating and delivering the signal from said transmitting station during a second time zone after completion of control of the time constant.

10. A radio receiver for receiving a signal, transmitted from a transmitting station at a predetermined period, intermittently during said period and demodulating and delivering the same, comprising:

a filter operable for filtering an input signal and having means for stepwise switching the time constant of said filter;

a demodulating circuit for demodulating and delivering an output signal from said filter;

a controller for controlling the time constant of said filter; and an input switching circuit responsive to a command from said controller, for selectively inputting to said filter either the signal from said transmitting station or a periodical signal having a predetermined frequency, wherein said controller performs control for applying said periodical signal to said filter to control the time constant of said filter in accordance with the output signal from said filter during a first time zone within said period and performs control for filtering, demodulating and delivering the signal from said transmitting station during a second time zone after completion of control of the time constant;

wherein said filter includes a plurality of capacitors connectable in parallel under the control of said controller and having a ratio of capacitance between sequential capacitors which is 1:2, and said controller responds to the output signal from said filter to control sequential connection of said capacitors beginning with a capacitor of a maximum capacitance and ending in a capacitor of a minimum capacitance so as to control the time constant of said filter.

11. A radio receiver for receiving a signal, transmitted from a transmitting station at a predetermined period intermittently during said period and demodulating and delivering the same comprising:

a filter operable for filtering an input signal and having means for stepwise switching the time constant of said filter;

a demodulating circuit for demodulating and delivering an output signal from said filter;

a controller for controlling the time constant of said filter; and an input switching circuit, responsive to a command from said controller, for selectively inputting to said filter either the signal from said transmitting station or a periodical signal having a predetermined frequency, wherein said controller performs control for applying said periodical signal to said filter to control the time constant of said filter in accordance with the output signal from said filter during a first time zone within said period and performs control for filtering, demodulating and delivering the signal from said transmitting station during a second time zone after completion of control of the time constant;

wherein said filter includes a plurality of resistance elements connected in series and short-circuited under the control of said controller and having a ratio of resistance between sequential resistance elements which is 1:2, and said controller responds to the output signal from said filter to control sequential short-circuiting of said resistance elements beginning with a resistance element of a maximum resistance and ending in a resistance element of a minimum resistance so as to control the time constant of said filter.

12. A radio receiver for receiving a signal, transmitted from a transmitting station at a predetermined period, intermittently at said period and demodulating and delivering the same, comprising:

a filter for filtering an input signal and having means for stepwise switching the time constant of said filter $2^n$ times by n elements for changing the time constant (n being an integer);

a demodulating circuit for delivering after demodulating an output signal from said filter;

a controller for controlling the time constant of said filter; and a selector, responsive to a command from said controller, for selectively connecting to said filter either an input line of said signal from said transmitting station or a standard signal generated from a constant voltage source for causing said filter to generate a triangular wave, wherein said controller performs control for applying said standard signal to said filter to control the time constant of said filter in accordance with the triangular wave output signal from said filter during a first time zone within said period and performs control for filtering, demodulating and delivering the signal from said transmitting station during a second time zone after completion of control of the time constant.

13. A radio receiver for receiving a signal, transmitted from a transmitting station at a predetermined period, intermittently at said period and demodulating and delivering the same comprising:

a filter operable for filtering an input signal and having means for stepwise switching of the time constant of said filter;

a demodulating circuit for demodulating and delivering an output signal from said filter;

a controller for controlling the time constant of said filter; and a selector, responsive to a command from said controller, for selectively connecting to said filter either an input line of said signal from said transmitting station or a standard signal generated from a constant voltage source for causing said filter to generate a triangular wave, wherein said controller performs control for applying said standard signal to said filter so as to control the time constant of said filter in accordance with the triangular wave output signal from said filter during a first time zone within said period and performs control for filtering, demodulating and delivering the signal from said transmitting station during a second time zone after completion of control of the time constant;

wherein said filter includes a plurality of capacitors connectable in parallel under the control of said controller and having a ratio of capacitance between sequential capacitors which is 1:2, and said controller responds to the output signal from said filter to control sequential connection of said capacitors beginning with a capacitor of a maximum capacitance and ending in a capacitor of a maximum capacitance so as to control the time constant of said filter.

14. A radio receiver for receiving a signal, transmitted from a transmitting station at a predetermined period, intermittently at said period and demodulating and delivering the same comprising:

a filters operable for filtering an input signal and having means for stepwise switching of the time constant of said filter;

a demodulating circuit for demodulating and delivering an output signal from said filter;

a controller for controlling the time constant of said filter; and a selector, responsive to a command from said controller, for selectively connecting to said filter either an input line of said signal from said transmitting station or a standard signal generated from a constant voltage source for causing said filter to generate a triangular wave, wherein said controller performs control for applying said standard signal to said filter so as to control the time constant of said filter in accordance with the triangular wave output signal from said filter during a first time zone within said .period and performs control for filtering, demodulating and delivering the signal from said transmitting station during a second time zone after completion of control of the time constant;

wherein said filter includes a plurality of resistance elements connected in series and short-circuited under the control of said controller and having a ratio of resistance between sequential resistance elements which is 1:2, and said controller responds to the output signal from said filter to control sequential short-circuiting of said resistance elements beginning with a resistance element of a maximum resistance and ending in a resistance element of a minimum resistance so as to control the time constant of said filter.

15. A radio receiver for receiving a signal, transmitted from a transmitting station at a predetermined period, intermittently at said period and demodulating and delivering the same, comprising:

a filter for filtering an input signal and having means for stepwise switching the time constant of said filter $2^n$ times by n elements for changing the time constant (n being an integer);

an analog-digital converter for analog-digital conversion of an output signal from said filter;

a demodulating circuit for delivering after demodulating an output signal from said analog-digital converter;

a controller for controlling the time constant of said filter; and an input switching circuit, responsive to a command from said controller, for selectively inputting to said filter either the signal from said transmitting station or a standard signal having a predetermined frequency, wherein said controller performs control for applying said standard signal to said filter to control the time constant of said filter in accordance with the output signal from said analog-digital converter during a first time zone within said period and performs control for filtering, demodulating and delivering the signal from said transmitting station during a second time zone after completion of control of the time constant.

16. A radio receiver according to claim 15, wherein said controller includes a standard pulse signal generator for generating said standard signal inputted to said filter, and a reference voltage supplied to said standard signal generator is used in common as a reference voltage supplied to said analog-digital converter.

17. A radio receiver for receiving a signal, transmitted from a transmitting station at a predetermined period, intermittently at said period and demodulating and delivering the same comprising:

a filter operable for filtering and input signal and having means for stepwise switching the time constant of said filter;

an analog-digital converter for analog-digital conversion of an output signal from said filter;

a demodulating circuit for demodulating and delivering an output signal from said analog-digital converter;.

a controller for controlling the time constant of said filter; and an input switching circuit, responsive to a command from said controller, for selectively inputting to said filter either the signal from said transmitting station or a periodical signal having a predetermined frequency, wherein said controller performs control for applying said periodical signal to said filter to control the time constant of said filter in accordance with the output signal from said analog,digital converter during a first time zone within said period and performs control for filtering, demodulating and delivering the signal from said transmitting station during a second time zone after completion of control of the time constant;

wherein said filter includes a plurality of capacitors connectable in parallel under the control of said controller and having a ratio of capacitance between sequential capacitors which is 1:2, and said controller responds to the output signal from said filter to control sequential connection of said capacitors beginning with a capacitor of a maximum capacitance and ending in a capacitor of a minimum capacitance so as to control the time constant of said filter.

* * * * *